United States Patent
Fuhrmann et al.

(10) Patent No.: US 11,257,909 B2
(45) Date of Patent: Feb. 22, 2022

(54) STACKED, HIGH-BLOCKING INGAAS SEMICONDUCTOR POWER DIODE

(71) Applicants: AZUR SPACE Solar Power GmbH, Heilbronn (DE); 3-5 Power Electronics GmbH, Dresden (DE)

(72) Inventors: Daniel Fuhrmann, Heilbronn (DE); Gregor Keller, Heilbronn (DE); Clemens Waechter, Lauffen am Neckar (DE); Volker Dudek, Ettlingen (DE)

(73) Assignees: AZUR SPACE Solar Power GmbH, Heilbronn (DE); 3-5 Power Electronics GmbH, Dresden (DE)

( * ) Notice: Subject to any disclaimer, the term of this patent is extended or adjusted under 35 U.S.C. 154(b) by 0 days.

(21) Appl. No.: 16/863,483

(22) Filed: Apr. 30, 2020

(65) Prior Publication Data
US 2020/0350407 A1    Nov. 5, 2020

(30) Foreign Application Priority Data
Apr. 30, 2019   (DE) .................. 10 2019 003 068.0

(51) Int. Cl.
*H01L 29/15* (2006.01)
*H01L 29/06* (2006.01)
(Continued)

(52) U.S. Cl.
CPC ........ *H01L 29/157* (2013.01); *H01L 29/0619* (2013.01); *H01L 29/1095* (2013.01); *H01L 29/201* (2013.01); *H01L 29/861* (2013.01)

(58) Field of Classification Search
CPC ............... H01L 29/157; H01L 29/0619; H01L 29/1095; H01L 29/201; H01L 29/04;
(Continued)

(56) References Cited

U.S. PATENT DOCUMENTS 4,471,367 A    9/1984 Chen et al.
5,268,582 A  * 12/1993 Kopf ................. H01L 21/02507
                                                         257/15
(Continued)

FOREIGN PATENT DOCUMENTS

CN          100356507 C    12/2007
DE    10 2016 013 540 A1    5/2018
(Continued)

OTHER PUBLICATIONS

Windhorn et al.; "The Electron Velocity-Field Characteristic for n-In . . . ."; IEEE Electron Device Letters, vol. Edl-3. No. 1 Jan. 1982.
(Continued)

*Primary Examiner* — Wasiul Haider
(74) *Attorney, Agent, or Firm* — Muncy, Geissler, Olds & Lowe, P.C.

(57) ABSTRACT

A stacked, high-blocking III-V semiconductor power diode having a first metallic terminal contact layer, formed at least in regions, and a highly doped semiconductor contact region of a first conductivity type and a first lattice constant. A drift layer of a second conductivity type and having a first lattice constant is furthermore provided. A semiconductor contact layer of a second conductivity, which includes an upper side and an underside, and a second metallic terminal contact layer are formed, and the second metallic terminal contact layer being integrally connected to the underside of the semiconductor contact layer, and the semiconductor contact layer having a second lattice constant at least on the underside, and the second lattice constant being the lattice constant of InP, and the drift layer and the highly doped semiconductor contact region each comprising an InGaAs compound or being made up of InGaAs.

12 Claims, 5 Drawing Sheets

(51) Int. Cl.
    *H01L 29/10*      (2006.01)
    *H01L 29/201*      (2006.01)
    *H01L 29/861*      (2006.01)

(58) Field of Classification Search
    CPC ............... H01L 29/8611; H01L 29/205; H01L 29/6609; H01L 29/861–885; H01L 29/20–207
    See application file for complete search history.

(56) References Cited

U.S. PATENT DOCUMENTS

| | | | |
|---|---|---|---|
| 5,677,551 A * | 10/1997 | Imamura | H01L 27/1443 257/187 |
| 10,074,540 B2 | 9/2018 | Dudek | |
| 10,192,745 B2 | 1/2019 | Dudek | |
| 10,263,124 B2 | 4/2019 | Dudek | |
| 10,312,381 B2 | 6/2019 | Dudek | |
| 10,340,394 B2 | 7/2019 | Dudek | |
| 10,411,146 B1 * | 9/2019 | Ariyawansa | H01L 31/105 |
| 2020/0266276 A1 * | 8/2020 | Clark | H01L 21/02463 |

FOREIGN PATENT DOCUMENTS

| | | |
|---|---|---|
| DE | 10 2016 013 541 A1 | 5/2018 |
| DE | 10 2016 015 056 A1 | 6/2018 |
| DE | 10 2017 002 935 A1 | 9/2018 |
| DE | 10 2017 002 936 A1 | 9/2018 |

OTHER PUBLICATIONS

Lian et al.; "Compostionally undulating step-graded InAsyP1-y buffer layer growth by metal-organic chemical vapor deposition"; Journal of Crystal Growth 363 (2013) 44-48.

Daehwan Jung et al.; "Design and growth of multi-functional InAsP metamorphic buffers for mid-infrared quantum well lasers on InP"; Journal of Applied Physics; Jan. 25, 2019.

German Ashkinazi, "GaAs Power Devices," pp. 8-9.

* cited by examiner

STACKED, HIGH-BLOCKING INGAAS SEMICONDUCTOR POWER DIODE

This nonprovisional application claims priority under 35 U.S.C. § 119(a) to German Patent Application No. 10 2019 003 068.0, which was filed in Germany on Apr. 30, 2019, and which is herein incorporated by reference.

BACKGROUND OF THE INVENTION

Field of the Invention

The present invention relates to a stacked, high-blocking InGaAs semiconductor power diode.

Description of the Background Art

A high-voltage-resistant PIN-type semiconductor diode made from GaAs is known from "GaAs Power Devices" by German Ashkinazi, ISBN 965-7094-19-4, pages 8 and 9.

Stacked, high-blocking InGaAs semiconductor power diodes and corresponding manufacturing methods are known from the publications DE 10 2016 013 540 A1 (which corresponds to U.S. Pat. No. 10,263,124), DE 10 2016 013 541 A1 (which corresponds to U.S. Pat. No. 10,074,540), DE 10 2016 015 056 A1 (which corresponds to U.S. Pat. No. 10,192,745), DE 10 2017 002 935 A1 (which corresponds to U.S. Pat. No. 10,312,381) and DE 10 2017 002 936 A1 (which corresponds to U.S. Pat. No. 10,340,394), which are all herein incorporated by reference.

Generic diodes have breakdown voltages above 200 V and should have a low forward voltage as well as a low series resistance to reduce power loss. The diodes should furthermore have preferably low leakage currents of less than 1 µA in the reverse direction.

SUMMARY OF THE INVENTION

It is therefore an object of the present invention to provide a device which refines the prior art.

According to an exemplary embodiment of the invention, a stacked, high-blocking InGaAs semiconductor power diode is provided, which includes at first metallic terminal contact layer, formed at least in regions, and a highly doped semiconductor contact region of a first conductivity type having a dopant concentration greater than $1 \cdot 10^{18}$ N/cm$^3$ and having a first lattice constant.

A drift layer of a second conductivity type, which has the first lattice constant and having a layer thickness greater than 10 µm, is furthermore provided.

A semiconductor contact layer of the second conductivity type, including an upper side and an underside, and having a dopant concentration greater than $5 \cdot 10^{17}$ N/cm$^3$ and a layer thickness of more than 0.5 µm and less than 150 µm or less than 450 µm or less than 650 µm or less than 850 µm, is arranged above a second metallic terminal contact layer.

The aforementioned regions and layers are arranged in the specified sequence.

The second metallic terminal contact layer is integrally connected to the underside of the semiconductor contact layer, the semiconductor contact layer having a second lattice constant at least on the underside, and the second lattice constant being the lattice constant of InP.

The drift layer and the highly doped semiconductor contact region each comprise an InGaAs compound or are made up of InGaAs.

The first lattice constant is higher than the lattice constant of GaAs.

According to the second subject matter of the invention, a stacked, high-blocking III-V semiconductor power diode is provided, which includes a first metallic terminal contact layer, formed at least in regions, and a highly doped semiconductor contact region of a second conductivity type having a dopant concentration of more than $1 \cdot 10^{19}$ N/cm$^3$ and having a first lattice constant.

A drift layer of a second conductivity type, having the first lattice constant and having a layer thickness greater than 10 µm, is furthermore provided.

A semiconductor contact layer of the first conductivity type, including an upper side and an underside, and having a dopant concentration greater than $5 \cdot 10^{17}$ N/cm$^3$ and a layer thickness of more than 0.5 µm and less than 150 µm or less than 450 µm or less than 650 µm or less than 850 µm, is arranged above a second metallic terminal contact layer.

The aforementioned regions and layers are arranged in the specified sequence.

The second metallic terminal contact layer is integrally connected to the underside of the semiconductor contact layer, the semiconductor contact layer having a second lattice constant at least on the underside, and the second lattice constant being the lattice constant of InP.

The drift layer and the highly doped semiconductor contact region each comprise an InGaAs compound or are made up of InGaAs.

The first lattice constant is higher than the lattice constant of GaAs.

It should be noted that the expression, "made up of III-V elements" may be understood to be specified substances without any additional III-V elements, while dopants, such as zinc or silicon or tin or carbon, are included. For example, "made up of InGaAs" consequently means that indium and gallium and arsenic, but not Al or P, etc., are exclusively incorporated as III-V elements.

The expression, "comprising a compound," correspondingly means in the case of InGaAs that along with indium and gallium and arsenic, further III-V elements, such as phosphorus or aluminum, may be included in addition to possible dopants.

The III-V semiconductor layers, i.e. the InGaAs and InP semiconductor layers, are preferably each provided with an at least partially planar or partially trough-shaped design with respect to each other, the lateral formation of the particular III-V semiconductor layers preferably having the same size for the planar arrangement.

It should also be noted that the expression, "semiconductor layer," is preferably used synonymously with the expression, "semiconductor region." However, the expression "semiconductor region" designates a generally trough-shaped formation of the semiconductor region, and the expression "semiconductor layer" generally designates a layer at least having a planar underside and/or a planar upper side.

The metallic terminal contact layers can each be highly electrically conductive and preferably comprise or are made up of one or multiple metal layers, the metal layers preferably also comprising compounds, such as Ge and/or Au and/or Pd.

The particular semiconductor contact layers can be designed to be directly adjacent to the metallic terminal contact layers on an upper side or on an underside of the InGaAs semiconductor power diodes.

It is furthermore understood that, despite the designation as InGaAs semiconductor power diodes LHD, an InP substrate can be formed on the underside in embodiments.

The terminal contact layers can be connected with the aid of bonding wires having contact fingers, so-called pins, in that the semiconductor power diodes are arranged on a carrier, for example in the form of a lead frame.

The breakdown voltage of the high-blocking InGaAs semiconductor power diodes is above 200 V. In particular, the breakdown voltage of the high-blocking InGaAs semiconductor power diodes is in a range between 300 V and 2,000 V or in a range between 600 V and 1,200 V or in a range between 1,000 V and 1,400 V or in a range between 1,200 V and 2,000 V.

An advantage of a lattice constant above GaAs is that lower forward voltages may be achieved than with GaAs, due to the smaller band gap resulting hereby, compared to GaAs. In other words, a band gap change may be implemented by incorporating indium into GaAs. InGaAs having a lattice constant above GaAs has a smaller band gap than GaAs, whereby lower forward voltages may be achieved in the diode, i.e. the efficiency of the diode increases.

With a lower forward voltage, the losses due to the InGaAs semiconductor power diode may be greatly reduced in the case of forward bias. With a higher mobility in the case of InGaAs, compared to GaAs, the transient electrical characteristics improve, for example, the switching frequency and the series resistance of the InGaAs semiconductor power diode.

Another advantage is that the electrons, in particular, have a smaller effective mass, or a higher mobility, in the InGaAs semiconductor power diode, compared to silicon and SiC.

In addition, the InGaAs semiconductor power diodes make it possible to reach higher temperatures at the p-n junctions, compared to Si, without the InGaAs semiconductor power diode being destroyed. InGaAs semiconductor power diodes may thus be used at temperatures up to 300° C., i.e. even in hot environments.

Another advantage compared to SiC is that InGaAs semiconductor power diodes are much more cost-effective to manufacture than are semiconductor structures made from SiC with comparable electrical properties.

The lattice constant of the compound of InGaAs is preferably in the range of the lattice constant of InP, or the InGaAs compound has exactly the same lattice constant as InP. In one refinement, a substrate layer of the first conductivity type or of the second conductivity type is formed between the drift layer and the second metallic terminal layer.

The semiconductor contact layer can comprises the substrate layer, or the semiconductor contact layer is made up of the substrate layer, the substrate layer comprising InP or being made up of InP.

A substrate layer of the first conductivity type or of the second conductivity type can be formed between the drift layer and the second metallic contact layer, and the substrate layer comprises a layer sequence with InP and GaAs or is made up of a layer sequence of InP and GaAs.

The semiconductor contact layer can be directly adjacent to the drift layer.

Alternatively, the highly doped semiconductor contact region is spaced a distance apart from the drift layer by a doped intermediate layer of a first conductivity type and having a dopant concentration of less than $5 \cdot 10^{15}$ N/cm$^3$ and having a first lattice constant and a thickness between 1 µm and 30 µm, the intermediate layer comprising an InGaAs compound or being made up of InGaAs.

The intermediate layer can comprise zinc and/or silicon and/or carbon as dopants. The dopant concentration of the intermediate layer is preferably lower than the dopant concentration of the highly doped semiconductor contact region directly adjacent to the intermediate layer. In particular, the dopant concentration of the intermediate layer is lower than the dopant concentration of the highly doped semiconductor contact region directly adjacent to the intermediate layer by magnitudes in a range between a factor of 2 to a factor of four.

The dopant concentration of the intermediate layer can be higher than the dopant concentration of the drift layer. The dopant concentration of the intermediate layer is most preferably higher than the dopant concentration of the drift layer at least by a factor of 2 to a factor of 100 or at least by a factor of 10 to a factor of 50.

It is understood that, in all embodiments, the intermediate layer has a different conductivity type than the drift layer, so that the p-n junction of the semiconductor power diode is formed between the drift layer and the intermediate layer in each case, provided that an intermediate layer is formed.

The intermediate layer can be provided with a p-doped design.

In an refinement, the first metallic terminal contact layer is integrally connected to the semiconductor contact region, and the second metallic terminal contact layer is integrally connected to the semiconductor contact layer.

A highly doped, metamorphic buffer layer sequence made from InGaAs can be formed between the drift layer and the second metallic terminal contact layer. The metamorphic buffer layer sequence has a dopant concentration greater than $1 \cdot 10^{17}$ N/cm$^3$ and a layer thickness of more than 0.5 µm and less than 20 µm.

The metamorphic buffer layer sequence is of the first conductivity type or of the second conductivity type, the metamorphic buffer sequence including an upper side having the first lattice constant and an underside having the second lattice constant, the upper side being arranged in the direction of the drift layer, and the first lattice constant being greater or less than the second lattice constant.

An advantage of the different lattice constants is that InGaAs compounds having a lower lattice constant or a higher lattice constant than that of InP may be formed above the metamorphic InGaAs buffer layer sequence. As a result, the bad gap of the InGaAs compounds above the metamorphic buffer layer sequence may be set in a targeted manner and is thus independent of the lattice constant of the InP layer situated beneath the metamorphic buffer layer sequence.

In other words, with the aid of the metamorphic buffer layer sequence, the active layers of the high-blocking InGaAs semiconductor power diode situated above the metamorphic buffer layer sequence may be at least partially decoupled in terms of their electrical characteristics from the electrical characteristics of the layers made from InP situated therebelow or at least having the lattice constant from InP.

A substrate layer of the first conductivity type or of the second conductivity type can be provided beneath the metamorphic buffer layer sequence.

The metamorphic buffer layer sequence can be spaced a distance apart from the drift layer by a doped intermediate layer of a first conductivity type or a second conductivity type having a dopant concentration of less than $5 \cdot 10^{15}$ N/cm$^3$ and having a first lattice constant and a thickness between 1 µm and 30 µm.

The metamorphic buffer layer sequence can be designed as a semiconductor contact layer. One advantage is that the stacked high-blocking III-V semiconductor power diode is thinner thereby than with a substrate formed beneath the buffer layer sequence. It is understood that the series resistance of the stacked semiconductor power diode is reduced with a decreasing thickness of the layer sequence, and the transient properties of the semiconductor power diode improve correspondingly.

The total thickness of the puffer layer sequence may be less than 30 µm or less than 20 µm or less than 5 µm, but greater than 0.2 µm. As a result, the total thickness of the stack of the III-V semiconductor power diode is in a range between 15 µm to 30 µm or in a range between 20 µm and 40 µm or is less than 60 µm or is less than 40 µm or is less than 120 µm or is less than 180 µm.

The metamorphic buffer sequence can be made from $In_xGa_{1-x}As$, where $0.1 \leq x \leq 1$, and $x=0.53$ on an underside, and x is greater or less on the upper side than the value of x on the underside. The limit value us preferably $x<1$, most preferably $x<0.8$ or $x<0.6$ or $x=0.5$.

In general, x increases or decreases between the individual layers of the buffer layer sequence, starting from the underside up to the upper side of the buffer layer sequence, in an alternative embodiment, the value of x decreasing or increasing slightly in an few directly consecutive layers.

Among the plurality of layers of the buffer layer sequence, the value of x increases or decreases between two directly consecutive layers. The increase or decrease of x takes place either in steps or linearly or in another manner.

The value of x increases monotonously or decreases monotonously from the underside up to the upper side. In another refinement, the value of x has a local maximum or a local minimum in the vicinity of the upper side of the buffer layer sequence and decreases or increases in the direction of the upper side. The value of x is preferably constant within the particular layer of the buffer layer sequence.

The InP substrate layer can be designed as a semiconductor contact layer of the second conductivity type or of the first conductivity type. The thickness of the substrate layer is preferably between 10 µm and 250 µm. Alternatively, the thickness of the substrate layer is between 50 µm and 130 µm or between 150 µm and 650 µm.

A second highly doped semiconductor layer having the first lattice constant can be formed between the metamorphic buffer layer sequence and the drift layer. The second highly doped semiconductor layer is of the second conductivity type or of the first conductivity type and has a dopant concentration greater than $1 \cdot 10^{18}$ N/cm$^3$ and a layer thickness of more than 0.1 µm.

Alternatively, the second highly doped semiconductor layer has a dopant concentration between $5 \cdot 10^{18}$ N/cm$^3$ and $5 \cdot 10^{19}$ N/cm$^3$ and a layer thickness between 0.5 µm and 4 µm.

The first conductivity type is p and the second conductivity type is n, or the first conductivity type is n and the second conductivity type is p.

The semiconductor contact region can be designed as a planar layer or in the shape of a trough. In an epitaxial design, in particular, the highly doped semiconductor contact region is designed as a planar layer, while in the case of an implantation, the highly doped semiconductor contact region is preferably provided with a trough-shaped design, in that dopants are implanted into the region of the drift layer for the purpose of forming the semiconductor contact region.

The first highly doped semiconductor layer can be made up of GaAs or InGaAs, or the first semiconductor layer comprises a GaAs compound or an InGaAs compound. The drift layer and the semiconductor contact region each preferably comprise an InGaAs compound or are each made up of InGaAs.

The semiconductor contact region and the semiconductor layers, i.e. the stack of the semiconductor power diode, can be provided with a monolithic design. In other words, the layers are arranged one on top of the other in a stacked manner without a semiconductor bond.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

For reasons of clarity, only one sectional view or one cross-sectional view of a stacked high-blocking InGaAs semiconductor power diode LHD is shown in all illustrations. The layer stack has an upper side and an underside.

It is understood that, despite the designation as InGaAs semiconductor power diodes LHD, an InP substrate is formed on the underside in a portion of the embodiments.

It should be noted that all InGaAs semiconductor power diodes LHD illustrated in the sectional view have either a square or a rectangular or a round circumference or a rectangular circumference with rounded edges, viewed from above.

In other words, the InGaAs semiconductor power diode LHD has the same layer sequence in the top view as in the particular cross-sectional view, only the topmost layer being visible.

The semiconductor contact regions and the semiconductor layers also each comprise an InGaAs compound or are made up of InGaAs, each semiconductor region and each semiconductor layer having an upper side and an underside in each case.

In each case, the upper side points in the direction of the metal contact or the metallic terminal contact arranged on the upper side of the layer stack, while the underside points in the direction of the metal contact or metallic terminal contact arranged on the underside of the layer stack.

It should also be noted that the expression, "intermediate layer," is preferably used synonymously with the expression, "intermediate region," for all embodiments.

However, the expression "intermediate region" or the expression "semiconductor contact region" designates a generally trough-shaped formation, while the expression "intermediate layer" or "semiconductor contact layer" generally designates a layer having at least a planar underside and/or a planar upper side.

Figure 9:
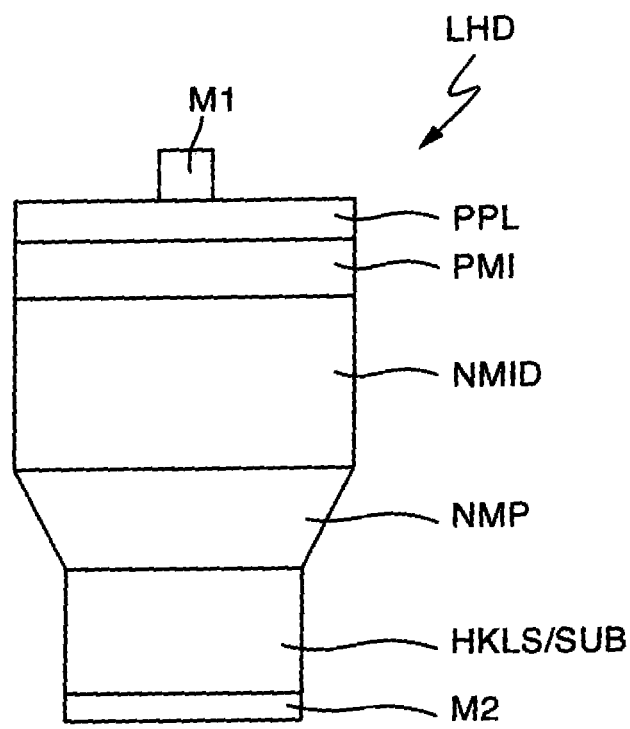
FIG. 9 shows a cross-sectional view of an exemplary embodiment of a semiconductor power diode according to the invention.
Figure 10:
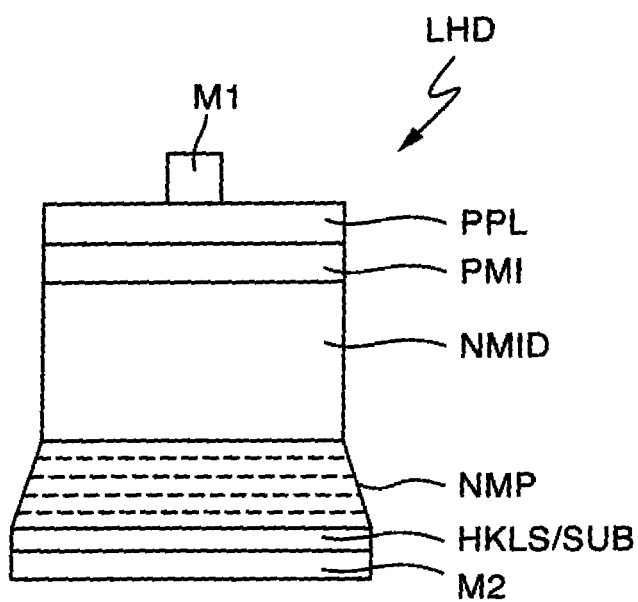
FIG. 10 shows a cross-sectional view of an exemplary embodiment of a semiconductor power diode according to the invention.

In particular, the metamorphic buffers shown in FIGS. 9 and 10 comprise a plurality of InGaAs semiconductor layers or are made up of a plurality of InGaAs semiconductor layers, the lattice constant generally changing from one InGaAs semiconductor layer to another InGaAs semiconductor layer.

In the present case, a plurality is understood to be a number of at least three and a maximum of thirty or a number of at least five and a maximum of ten semiconductor layers. Moreover, the metamorphic buffer preferably has a low-resistive, i.e. highly doped, design in each case.

The fact that the InGaAs semiconductor power diode has an upper side and an underside furthermore applies to all illustrated embodiments, the InGaAs semiconductor power diode being arranged as a so-called "DIE" on a support designed as a metal frame or metal carrier, also referred to as a "lead frame," preferably with the aid of a metallic terminal contact layer formed on the underside.

A preferably large design, in particular covering the entire surface, of the metallic terminal contact layer on the underside improves the thermal coupling to the support.

Figure 1:
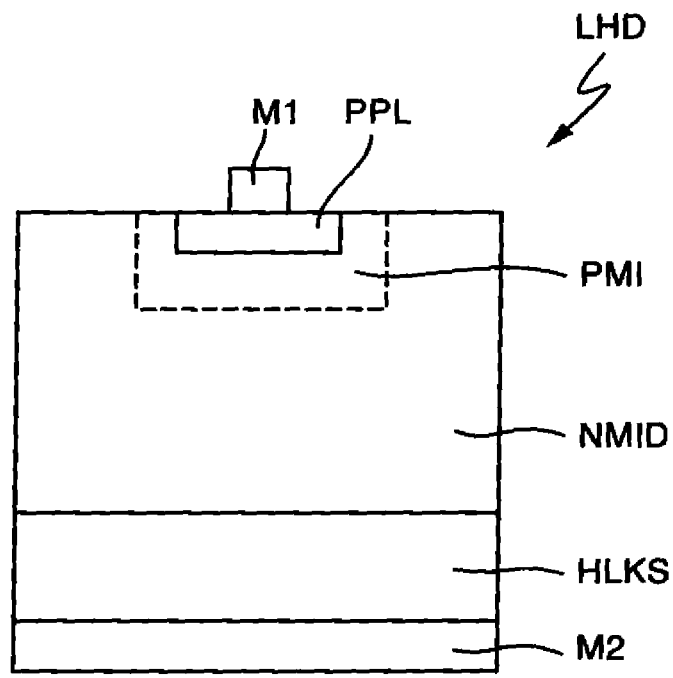
FIG. 1 shows a cross-sectional view of an exemplary embodiment of a semiconductor power diode according to the invention.

The illustration in FIG. 1 shows a stacked, high-blocking InGaAs semiconductor power diode LHD in a p-n structure.

Semiconductor power diode LHD includes a first metallic terminal contact layer M1, formed in regions, and a p+ highly doped semiconductor region PPL having a dopant concentration greater than $1 \cdot 10^{18}$ N/cm$^3$ and having a first lattice constant.

Semiconductor contact region PPL is provided with a trough-shaped design and is preferably manufactured by means of a mask and implantation process. Dopants are introduced into a region of the n− drift layer or the p− drift layer, the dopants preferably being activated by means of a temperature process. First metallic terminal contact layer M1 and p+ highly doped semiconductor contact region PPL are integrally connected to each other.

A p− intermediate region PMI is arranged in a trough-shaped formation between p+ highly doped semiconductor contact region PPL and an n− drift layer NMID, so that p+ highly doped semiconductor contact region PPL is spaced a distance apart from n− drift layer NMID on all sides. The p− doped intermediate region PMI is drawn with a dashed line, since p− doped intermediate region PMI is optional, i.e. p− intermediate region PMI is not formed in a non-illustrated embodiment. It is understood that, without p− intermediate region PMI, p+ highly doped semiconductor contact region PPL is integrally connected to n− drift layer NMID.

The p− intermediate region PMI has a doping which is lower than p+ highly doped semiconductor contact region PPL and higher than n− drift layer NMID and is integrally connected to p+ highly doped semiconductor contact region PPL and n− drift layer NMID. The p− intermediate region PMI has a dopant concentration of less than $5 \cdot 10^{15}$ N/cm$^3$ and the first lattice constant and a thickness between 1 μm and 30 μm.

In addition to n− drift layer NMID having the first lattice constant and having a layer thickness greater than 10 μm, InGaAs semiconductor power diode LHD also includes an n+ highly doped semiconductor contact layer HLKS having a dopant concentration greater than $5 \cdot 10^{17}$ N/cm$^3$ and a layer thickness of more than 0.5 μm and less than 20 μm.

The n− drift layer NMID and n+ highly doped semiconductor contact layer HLKS are integrally connected to each other. The n+ highly doped semiconductor contact layer HLKS has a second lattice constant, the second lattice constant being equal in size to the first lattice constant, i.e. all semiconductor layers of the stack of semiconductor power diode LHD are lattice-matched to each other. The underside of highly doped semiconductor contact layer HLKS is integrally connected to a second metallic terminal contact layer M2.

The aforementioned regions and layers are arranged in the specified sequence.

In an alternative embodiment, which is not illustrated, the high-blocking InGaAs semiconductor power diode comprises further InGaAs semiconductor layers, in particular at the p-n junction and/or between a very highly doped semiconductor layer or a very highly doped semiconductor region having a dopant concentration of more than $1 \cdot 10^{17}$ N/cm$^3$ and a low-doped semiconductor layer or semiconductor region having a dopant concentration of less than $5 \cdot 10^{17}$ N/cm$^3$.

Figure 2:
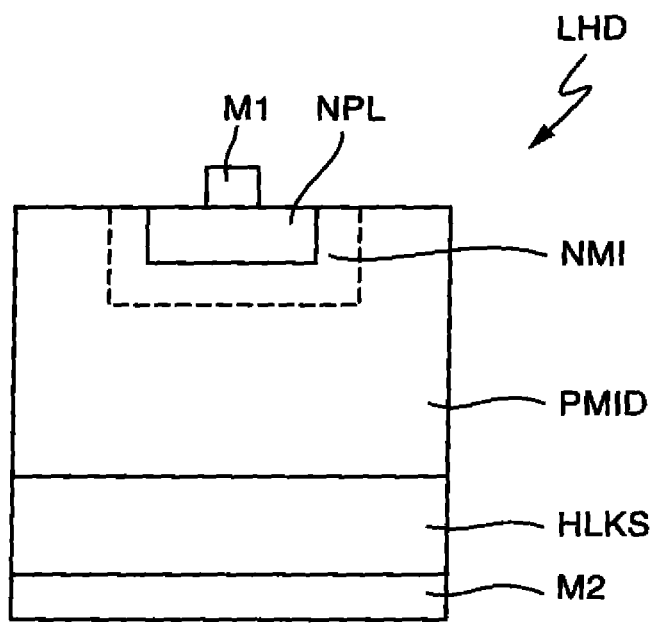
FIG. 2 shows a cross-sectional view of an exemplary embodiment of a semiconductor power diode according to the invention.

The illustration in FIG. 2 shows a stacked, high-blocking III-V semiconductor power diode LHD in an n-p structure. Semiconductor power diode LHD includes a first metallic terminal contact layer M1, formed in regions, and an n+ highly doped semiconductor region NPL having a dopant concentration greater than $1 \cdot 10^{18}$ N/cm$^3$ and having a first lattice constant.

Semiconductor contact region NPL is provided with a trough-shaped design and is preferably manufactured by means of a mask and implantation process. Firs metallic terminal contact layer M1 and n+ highly doped semiconductor contact region NPL are integrally connected to each other.

An n− intermediate region NMI is arranged in a trough-shaped formation between n+ highly doped semiconductor contact region NPL and a p− drift layer PMID, so that n+ highly doped semiconductor contact region NPL is spaced a distance apart from p− drift layer PMID on all sides. The n− doped intermediate region NMI is drawn with a dashed line, since n− doped intermediate region NMI is optional, i.e. n− intermediate region PMI is not formed in a non-illustrated embodiment.

It is understood that, without n− intermediate region NMI, n+ highly doped semiconductor contact region NPL is integrally connected to p− drift layer PMID.

The n− intermediate region NMI has a doping which is lower than n+ highly doped semiconductor contact region NPL and higher than p− drift layer PMID and is integrally connected to n+ highly doped semiconductor contact region NPL and p− drift layer PMID. The n− intermediate region NMI has a dopant concentration of less than $5 \cdot 10^{15}$ N/cm$^3$ and the first lattice constant and a thickness between 1 µm and 30 µm.

In addition to p− drift layer PMID having the first lattice constant and having a layer thickness greater than 10 µm, InGaAs semiconductor power diode LHD also includes a p+ highly doped semiconductor contact layer HLKS having a dopant concentration greater than $5 \cdot 10^{17}$ N/cm$^3$ and a layer thickness of more than 0.5 µm and less than 20 µm.

The p− drift layer PMID and p+ highly doped semiconductor contact layer HLKS are integrally connected to each other. The p+ highly doped semiconductor contact layer HLKS has a second lattice constant, the second lattice constant being equal in size to the first lattice constant, i.e. all semiconductor layers of the stack of semiconductor power diode LHD are lattice-matched to each other. The underside of highly doped semiconductor contact layer HLKS is integrally connected to a second metallic terminal contact layer M2.

The aforementioned regions and layers are arranged in the specified sequence. In an alternative embodiment, which is not illustrated, the high-blocking InGaAs semiconductor power diode comprises further InGaAs semiconductor layers, in particular at the p-n junction and/or between a very highly doped semiconductor layer or semiconductor region having a dopant concentration of more than $1 \cdot 10^{17}$ N/cm$^3$ and a very low-doped semiconductor layer or semiconductor region having a dopant concentration of less than $5 \cdot 10^{17}$ N/cm$^3$.

Figure 3:
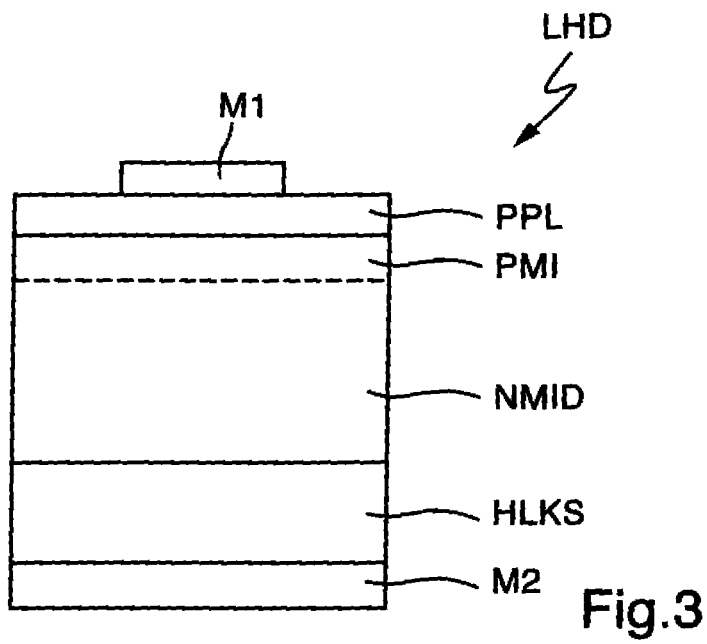
FIG. 3 shows a cross-sectional view of an exemplary embodiment of a semiconductor power diode according to the invention.

A third embodiment is illustrated in FIG. 3. Only the differences from the embodiment shown in connection with FIG. 1 are explained below.

Intermediate layer PMI and highly doped p+ semiconductor contact layer p+ PPL are each provided with a planar design. Layer arrangements of this type are manufactured by means of epitaxial processes, in particular with the aid of a MOVPE system. The p− doped intermediate layer is drawn with a dashed line, since the p− doped intermediate layer is optional, i.e. the p− intermediate layer is not formed in a non-illustrated embodiment.

Figure 4:
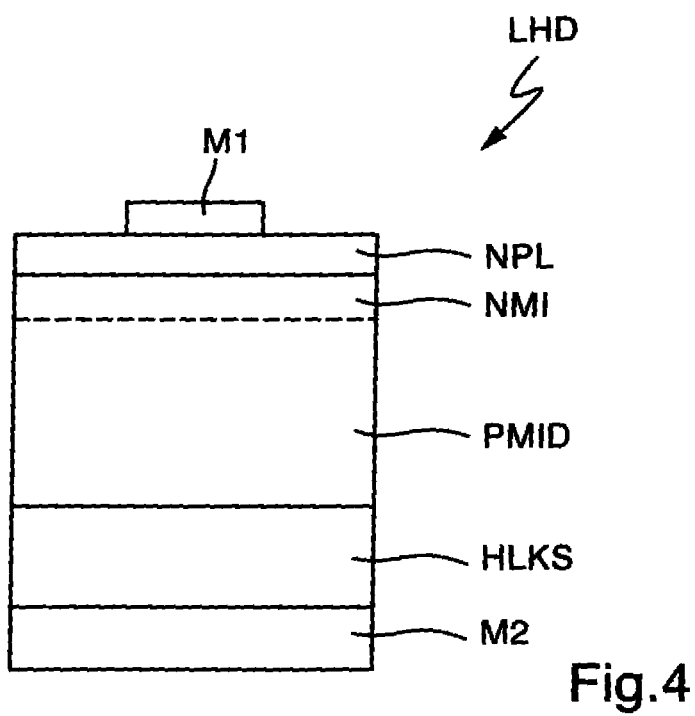
FIG. 4 shows a cross-sectional view of an exemplary embodiment of a semiconductor power diode according to the invention.

A fourth embodiment is illustrated in FIG. 4. Only the differences from the embodiment shown in connection with FIG. 2 are explained below.

Intermediate layer NMI and highly doped n+ semiconductor contact layer n+ NPL are each provided with a planar design. Layer arrangements of this type are manufactured by means of epitaxial processes, in particular with the aid of a MOVPE system. The n− doped intermediate layer is drawn with a dashed line, since the n− doped intermediate layer is optional, i.e. the n− intermediate layer is not formed in a non-illustrated embodiment.

Figure 5:
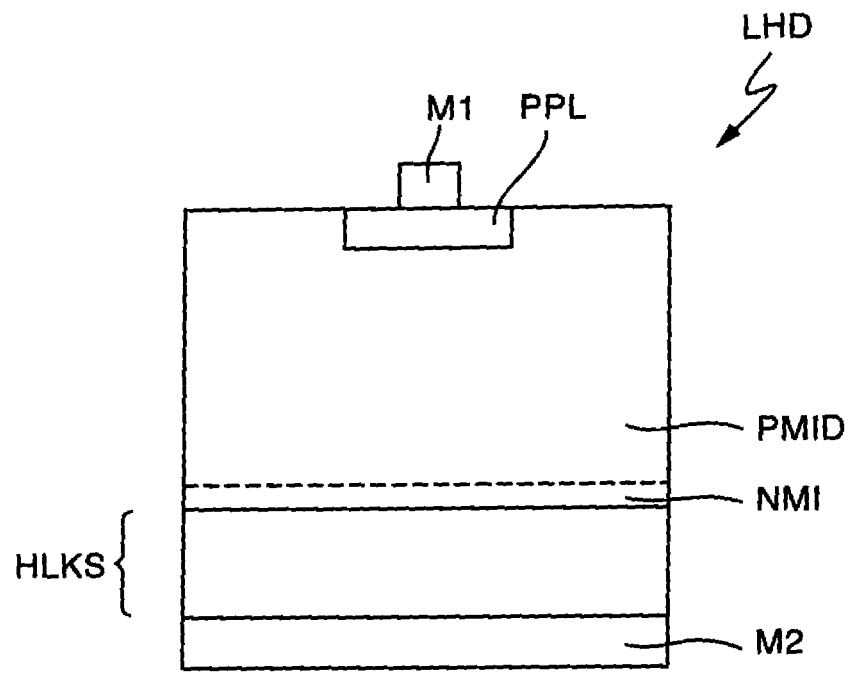
FIG. 5 shows a cross-sectional view of an exemplary embodiment of a semiconductor power diode according to the invention.

A fifth embodiment is illustrated in FIG. 5. Only the differences from the embodiment shown in connection with FIG. 1 are explained below.

The p− drift layer PMID is integrally adjacent to highly doped p+ semiconductor contact region PPL provided with a trough-shaped design, p+ semiconductor contact region PPL being generated by means of an implantation into p− drift layer PMID. As a result, the p− drift layer on the upper side no longer has a planar design.

The n− doped intermediate layer NMI and n+ highly doped semiconductor contact layer n+ HLKS are integrally adjacent to p− drift layer PMID, p− drift layer PMID being formed in a planar manner on the underside and n+ highly doped semiconductor contact layer HLKS being formed in a planar manner on the upper side and on the underside.

The n− doped intermediate layer NMI is drawn with a dashed line, since n− doped intermediate layer NMI is optional, i.e. n− intermediate layer NMI is not formed in a non-illustrated embodiment. It is understood that, without n− intermediate layer NMI, the underside of p− drift layer PMID is integrally connected to the upper side of n+ semiconductor contact layer HLKS.

Figure 6:
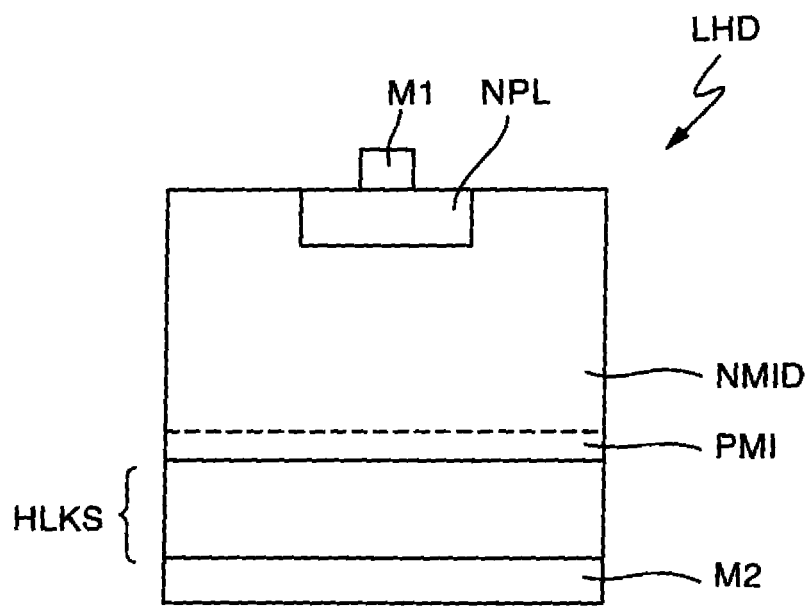
FIG. 6 shows a cross-sectional view of an exemplary embodiment of a semiconductor power diode according to the invention.

A sixth embodiment is illustrated in FIG. 6. Only the differences from the embodiment shown in connection with FIG. 2 are explained below.

An n− drift layer NMID is integrally adjacent to highly doped n+ semiconductor contact region NPL provided with a trough-shaped design, n+ semiconductor contact region NPL being generated by means of an implantation into n− drift layer NMID. As a result, n− drift layer NMID on the upper side no longer has a planar design.

A p− doped intermediate layer PMI and p+ highly doped semiconductor contact layer p+ HLKS are integrally adjacent to n− drift layer NMID, n− drift layer NMID being formed in a planar manner on the underside and p+ highly doped semiconductor contact layer HLKS being formed in a planar manner on the upper side and on the underside.

The p− doped intermediate layer PMI is drawn with a dashed line, since p− doped intermediate layer PMI is optional, i.e. p− intermediate layer PMI is not formed in a non-illustrated embodiment. It is understood that, without p− intermediate layer PMI, the underside of n− drift layer NMID is integrally connected to the upper side of p+ semiconductor contact layer HLKS.

Figure 7:
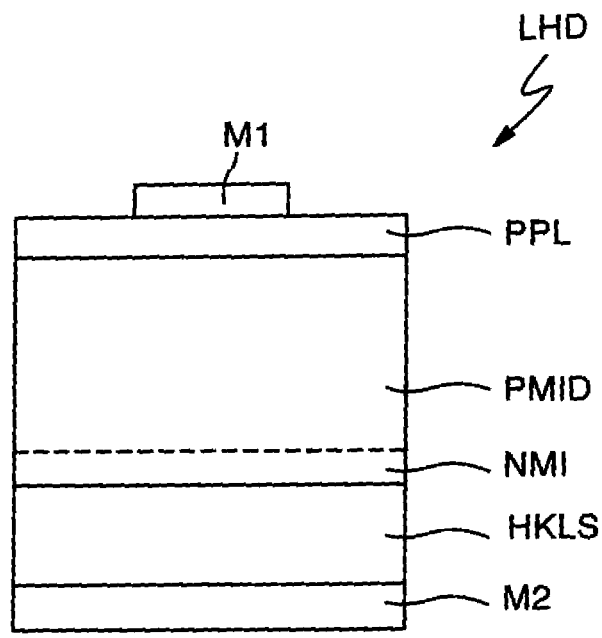
FIG. 7 shows a cross-sectional view of an exemplary embodiment of a semiconductor power diode according to the invention.

A seventh embodiment is illustrated in FIG. 7. Only the differences from the embodiment shown in connection with FIG. 5 are explained below.

The p− drift layer PMID is integrally adjacent to the highly doped p+ semiconductor contact region PPL provided with a layered design, p+ semiconductor contact region PPL being generated by means of an epitaxial process step. As a result, p+ semiconductor region PPL and p− drift layer PMID are each provided with a planar design.

Figure 8:
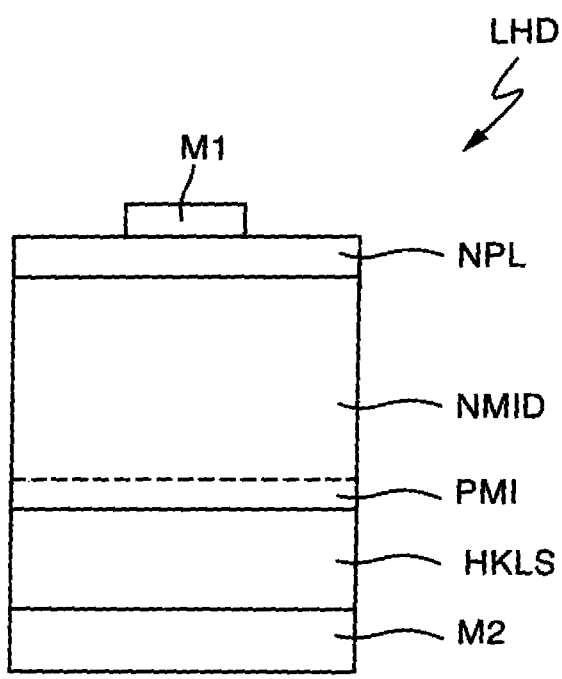
FIG. 8 shows a cross-sectional view of an exemplary embodiment of a semiconductor power diode according to the invention.

An eighth embodiment is illustrated in FIG. 8. Only the differences from the embodiment shown in connection with FIG. 6 are explained below.

The n− drift layer NMID is integrally adjacent to the highly doped n+ semiconductor contact region NPL provided with a layered design, n+ semiconductor contact region NPL being generated by means of an epitaxial process step. As a result, n+ semiconductor region NPL and n− drift layer NMID are each provided with a planar design.

A ninth embodiment of a p-over-n structure is illustrated in FIG. 9. In particular, only the differences from the embodiments shown in connection with FIGS. 1 and 3 are explained below.

First metallic terminal contact layer M1 formed in regions on the upper side of stacked semiconductor power diode LHD is integrally connected to the upper side of p+ highly doped semiconductor contact region PPL made up of an InGaAs compound. The underside of p+ highly doped semiconductor contact region PPL is integrally connected to the upper side of p− intermediate layer PMI made up of an InGaAs compound. Intermediate layer PMI and p+ highly doped semiconductor contact player p+ PPL are each provided with a planar design, the two layer arrangements preferably being manufactured by means of epitaxial processes using an MOVPE system.

The underside of p− intermediate layer PMI is integrally connected to the upper side of planar n− drift layer NMID made up of an InGaAs compound.

The underside of n− drift layer NMID is integrally connected to the upper side of a planar n+ highly doped metamorphic buffer layer sequence NMP made up of an InGaAs compound.

The n+ highly doped metamorphic buffer layer sequence NMP has a dopant concentration greater than $5 \cdot 10^{17}$ N/cm$^3$ or greater than $1 \cdot 10^{17}$ N/cm$^3$ or greater than $5 \cdot 10^{16}$ N/cm$^3$ or greater than $2 \cdot 10^{16}$ N/cm$^3$ and a layer thickness of more than 0.5 µm and less than 20 µm. The n− drift layer NMID and n+ highly doped metamorphic buffer layer sequence NMP are integrally connected to each other.

It is understood that the upper side of n+ highly doped metamorphic buffer layer sequence NMP has the same lattice constant as the InGaAs semiconductor layers situated on the upper side of n+ highly doped metamorphic buffer layer sequence NMP. In other words, the InGaAs semiconductor layers situated thereon are lattice-matched to each other, the lattice constant of the InGaAs semiconductor layers situated thereon being greater than the second lattice constant and thereby greater than the lattice constant of InP. The lattice constants are illustrated in FIG. 9 by the width of the particular semiconductor layers or the semiconductor region.

The underside of n+ highly doped metamorphic buffer layer sequence NMP is integrally connected to the upper side of the n+ doped semiconductor contact layer designed as a substrate SUB. The n+ doped substrate SUB is made up of InP and is preferably not thinned. For example, a 4" InP wafer has a thickness of approximately 450 µm or 650 µm, and a 6" InP wafer has a thickness of approximately 725 µm.

The underside of n+ doped InP substrate SUB is integrally connected to second metallic contact layer M2 designed to cover the entire surface. Second metallic terminal layer M2 is preferably made up of an alloy of Au and Pd.

In one embodiment, which is not illustrated, the individual semiconductor layers made up of the InGaAs compound are at least partially not integrally connected to each other, in that further layers made up of an InGaAs compound are formed therebetween. For example, a further n− doped intermediately layer may be arranged between n− drift layer NMID and n+ highly doped metamorphic buffer layer sequence NMP, the further n− doped intermediate layer having a thickness between 3 µm and 15 µm. Moreover, the doping of the further n− intermediate layer is higher than the doping of n− drift layer NMID but lower than the doping of n+ highly doped metamorphic buffer layer sequence NMP.

It should also be noted that an n-over-p structure corresponding to the embodiments illustrated in connection with the illustrations in FIG. 4 or 6 or 8 may be formed instead of the p-over-n structure.

A tenth embodiment is illustrated in FIG. 10. Only the differences from the embodiment shown in connection with FIG. 9 are explained below.

The first lattice constant of the InGaAs semiconductor layers situated on n+ highly doped metamorphic puffer layer sequence NMP is lower than the second lattice constant and thereby lower than the lattice constant of InP. Like in FIG. 9, the lattice constants in FIG. 10 are also illustrated by the width of the individual semiconductor layers or the semiconductor region.

The underside of n+ highly toped metamorphic buffer layer sequence NMP is integrally connected to the upper side of n+ doped semiconductor contact layer HLKS designed as a substrate SUB, InP substrate SUB being made thinner and having a thickness between 60 µm and 200 µm.

In embodiments, which are not illustrated, a first n+ highly doped semiconductor layer made from InGaAs and designed as a semiconductor contact layer HKLS is arranged between n+ highly doped metamorphic buffer layer sequence NMP and second metallic terminal contact layer M2. The first highly doped semiconductor layer has a dopant concentration greater than $1 \cdot 10^{18}$ N/cm$^3$ and a layer thickness of more than 0.1 µm and less than 10 µm or less than 5 µm.

A second n+ highly doped semiconductor layer made from an InGaAs compound is arranged between n− drift layer NMID and n+ highly doped metamorphic buffer layer sequence NMP. It is understood that the lattice constant of the second n+ highly doped semiconductor layer corresponds to the lattice constant of the n− drift layer NMID situated thereabove, i.e. the second n+ highly doped semiconductor layer and n− drift layer NMID are lattice-matched to each other.

The second n+ highly doped semiconductor layer has a dopant concentration greater than $1 \cdot 10^{18}$ N/cm$^3$ and a layer thickness of more than 0.1 µm.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked, high-blocking InGaAs semiconductor power diode comprising:
   a first metallic terminal contact layer formed at least in regions;
   a highly doped semiconductor contact region of a first conductivity type, having a dopant concentration greater than $1 \times 1018$ N/cm3 and having a first lattice constant;
   a drift layer of a second conductivity type, having the first lattice constant and having a layer thickness greater than 10 um;
   a semiconductor contact layer of the second conductivity type, including an upper side and an underside, and having a dopant concentration greater than $5 \times 1017$ N/cm3 and a layer thickness of more than 0.5 um and less than 850 um;
   a second metallic terminal contact layer,
   wherein the first metallic terminal contact layer is formed above the highly doped semiconductor contact region, the highly doped semiconductor contact region is formed above the drift layer, the drift layer is formed above the semiconductor contact layer, and the semiconductor contact layer is formed above the second metallic terminal contact layer,
   wherein the second metallic terminal contact layer is integrally connected to the underside of the semiconductor contact layer,
   wherein the semiconductor contact layer has a second lattice constant at least on the underside, and the second lattice constant being the lattice constant of InP,
   wherein the drift layer and the highly doped semiconductor contact region each comprise an InGaAs compound or consist substantially of InGaAs, wherein the first lattice constant is higher than the lattice constant of GaAs, and wherein the highly doped semiconductor contact region is directly adjacent to the drift layer, or wherein the highly doped semiconductor contact region is separated from the drift layer by a doped intermediate layer (, which is a single layer of first conductivity type), the doped intermediate layer being directly adjacent to the drift layer and the highly doped semiconductor contact region being directly adjacent to the doped intermediate layer, wherein the doped intermediate layer is a single layer of the first conductivity type.

2. The stacked, high-blocking InGaAs semiconductor power diode according to claim 1, wherein the highly doped semiconductor contact region is spaced a distance apart from the drift layer by the doped intermediate layer of the first conductivity type and having a dopant concentration of less than $5 \times 10^{15}$ N/cm$^3$ and having the first lattice constant and a thickness between 1 um and 30 um, and wherein the doped intermediate layer comprises an InGaAs compound or consists substantially of InGaAs.

3. The stacked, high-blocking InGaAs semiconductor power diode according to claim 1, wherein the first lattice constant and the second lattice constant are equal in size, and the semiconductor contact layer comprises InP or consists substantially of InP.

4. The stacked, high-blocking InGaAs semiconductor power diode according to claim 1, wherein a highly doped metamorphic buffer layer sequence is formed between the drift layer and the second metallic terminal contact layer, and wherein the metamorphic buffer layer sequence has a dopant concentration greater than $5 \cdot 10^{17}$ N/cm$^3$ or greater than $1 \cdot 10^{17}$ N/cm$^3$ or greater than $5 \cdot 10^{16}$ N/cm$^3$ or greater than $2 \cdot 10^{16}$ N/cm$^3$ and a layer thickness of more than 0.5 μm and less than 20 μm, and which is of the first conductivity type or the second conductivity type, and wherein the metamorphic buffer layer sequence includes an upper side having the first lattice constant and an underside having the second lattice constant, the upper side being arranged in the direction of the drift layer, and the first lattice constant being higher than or lower than the second lattice constant.

5. The stacked, high-blocking InGaAs semiconductor power diode according to claim 4, wherein the semiconductor contact layer comprises the metamorphic buffer layer or consists substantially of the metamorphic buffer layer.

6. The stacked, high-blocking InGaAs semiconductor power diode according to claim 1, wherein the first conductivity type is p and the second conductivity type is n, or the first conductivity type is n and the second conductivity type is p.

7. The stacked, high-blocking InGaAs semiconductor power diode according to claim 1, wherein the highly doped semiconductor contact region is a planar layer or has a trough-shaped design.

8. The stacked, high-blocking InGaAs semiconductor power diode according to claim 1, wherein the highly doped semiconductor contact region, the drift layer, and the semiconductor layers contact layer have a monolithic design.

9. The stacked, high-blocking InGaAs semiconductor power diode according to claim 1, wherein a substrate layer of the first conductivity type or of the second conductivity type is formed between the drift layer and the second metallic terminal contact layer, and the substrate layer comprises InP or is made up of InP.

10. The stacked, high-blocking InGaAs semiconductor power diode according to claim 9, wherein the semiconductor contact layer comprises the substrate layer or consists substantially of the substrate layer.

11. The stacked, high-blocking InGaAs semiconductor power diode according to claim 1, wherein a substrate layer of the first conductivity type or of the second conductivity type is formed between the drift layer and the second metallic terminal contact layer, and the substrate layer comprises a layer sequence of InP and GaAs or consists substantially of the layer sequence of InP and GaAs.

12. The stacked, high-blocking InGaAs semiconductor power diode according to claim 1, wherein a breakdown voltage of the power diode is over 200 V.

* * * * *